(12) United States Patent
Jadhav et al.

(10) Patent No.: US 7,955,900 B2
(45) Date of Patent: Jun. 7, 2011

(54) COATED THERMAL INTERFACE IN INTEGRATED CIRCUIT DIE

(75) Inventors: Susheel G. Jadhav, Chandler, AZ (US); Carl Deppisch, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 964 days.

(21) Appl. No.: 11/278,337

(22) Filed: Mar. 31, 2006

(65) Prior Publication Data

US 2007/0231967 A1    Oct. 4, 2007

(51) Int. Cl.
*H01L 21/00* (2006.01)
(52) U.S. Cl. ........ 438/122; 438/119; 257/712; 257/713; 257/718; 257/719
(58) Field of Classification Search .................. 438/119, 438/122; 257/712, 713, 718, 719
See application file for complete search history.

(56) References Cited

U.S. PATENT DOCUMENTS

| | | | | |
|---|---|---|---|---|
| 5,643,834 A * | 7/1997 | Harada et al. | .................. | 438/122 |
| 6,504,242 B1 | 1/2003 | Deppisch et al. | | |
| 7,369,411 B2 * | 5/2008 | Hill et al. | ........................ | 361/708 |
| 7,482,197 B2 * | 1/2009 | Furman et al. | ................. | 438/106 |
| 2005/0280142 A1 * | 12/2005 | Hua et al. | ........................ | 257/707 |
| 2006/0051898 A1 * | 3/2006 | Lu et al. | ......................... | 438/121 |

FOREIGN PATENT DOCUMENTS

| | | |
|---|---|---|
| CN | 1582494 A | 2/2005 |
| TW | 411592 B | 11/2000 |

OTHER PUBLICATIONS

Shieu, F. S., et al., "Intermetallic Phase Formation and Shear Strength of a Au-In Microjoint", *Thin Solid Films*, 346(1), (1999), 125-129.
Office Action Received for Chinese Patent Application No. 200710093649.2, Mailed Dec. 5, 2008, 7 pgs. (English Translation).
Office Action Received for Taiwanese Patent Application No. 96110788, Mailed on Nov. 10, 2010, 8 pages of Taiwanese Office Action and 1 page of English translation of Search Report.

* cited by examiner

*Primary Examiner* — Zandra Smith
*Assistant Examiner* — Christy L Novacek
(74) *Attorney, Agent, or Firm* — John N. Greaves

(57) ABSTRACT

Some embodiments of the invention include a coated thermal interface to bond a die with a heat spreader. The coated thermal interface may be used to bond the die with the heat spreader without flux. Other embodiments are described and claimed.

17 Claims, 4 Drawing Sheets

COATED THERMAL INTERFACE IN INTEGRATED CIRCUIT DIE

FIELD

Embodiments of the present invention relate to integrated circuit packaging, and particularly to an interface between a die and a heat spreader in integrated circuit packages.

BACKGROUND

Computers and other electronic devices usually have a semiconductor die enclosed in an integrated circuit package. The die often has an integrated circuit for performing an electrical function. The integrated circuit generates heat when it operates. Excessive heat may destroy the integrated circuit. To dissipate the heat, the die is commonly attached to a heat spreader.

A thermal interface is often used to bond the die to the heat spreader. Some thermal interfaces are made of soldering material. Some conventional techniques use flux during soldering of these thermal interfaces to improve bonding. In some cases, flux may create voids in the thermal interface. Thus, the thermal interface in these conventional techniques is often relatively thick to reduce or prevent voiding. A thick thermal interface, however, may increase a thermal resistance between the die and the heat spreader, making heat dissipation less effective.

One way to reduce the thermal resistance is to lower the thickness of the thermal interface. However, lowering the thickness of the thermal interface may lead to excessive voiding or expensive equipment.

DESCRIPTION OF EMBODIMENTS

Figure 1:
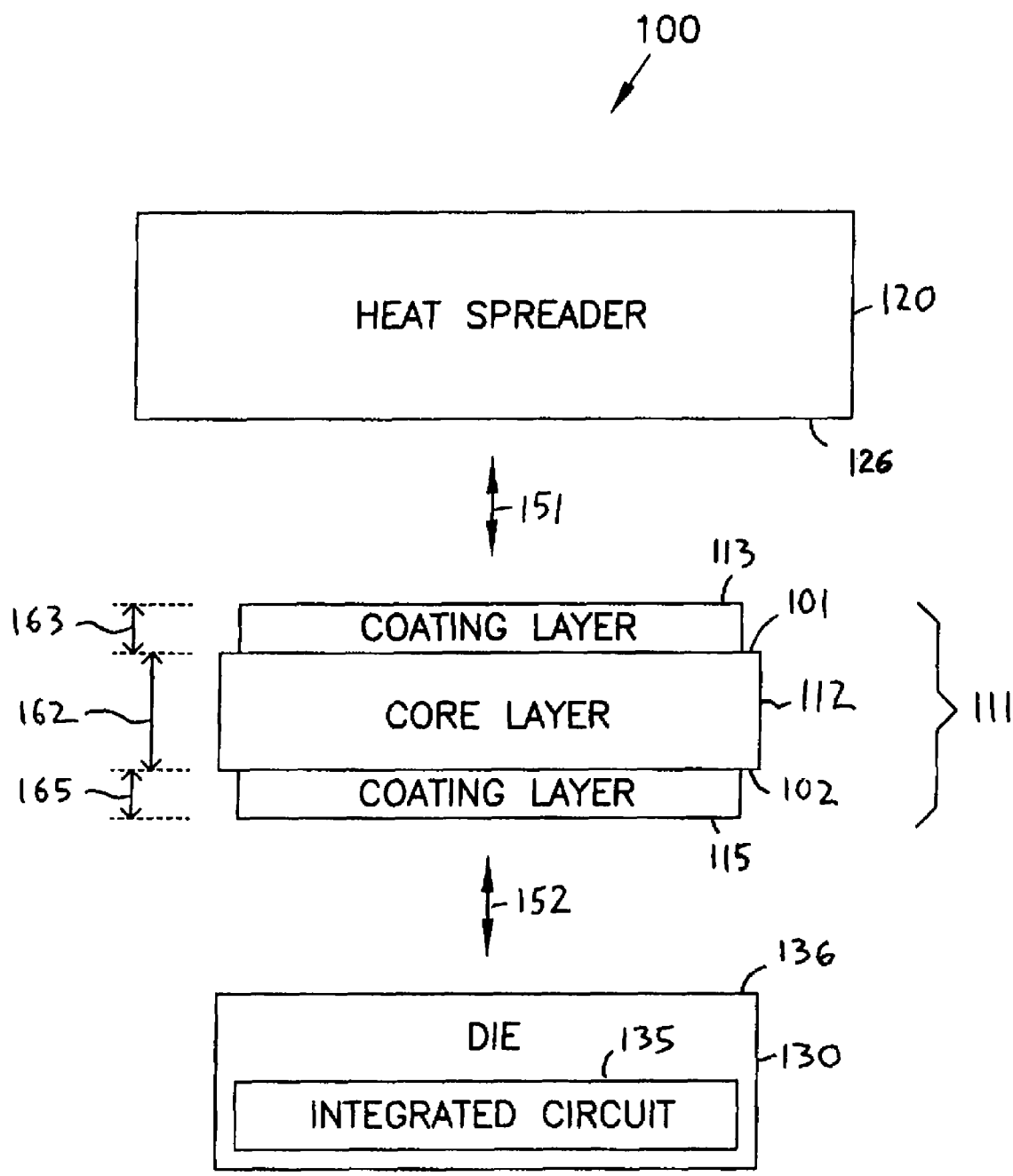
FIG. 1 shows an exploded view of an apparatus according to an embodiment of the invention.

FIG. 1 shows an exploded view of an apparatus 100 before it is assembled according to an embodiment of the invention. Apparatus 100 may be a portion of an integrated circuit package that resides in computers or other electronic systems such as cellular phones. In FIG. 1, apparatus 100 includes a thermal interface 111 placed between a heat spreader 120 and a die 130. The component of apparatus 100 may be assembled or bonded together in directions indicated by arrows 151 and 152.

Heat spreader 120 may include copper or a copper with one or more layers of other metals covering at least a portion of a surface 126 of heat spreader 120. Die 130 includes a semiconductor material in which an integrated circuit 135 is formed. Integrated circuit 135 may have circuitry to perform a function such as processing data, or storing data, or both. Die 130 has surface 136; at least a portion of surface 136 may be covered with metal. Thermal interface 111, when bonded to die 130 and heat spreader 120, allows some amount of heat from die 130 to dissipate or spread to heat spreader 120 to maintain proper thermal condition for apparatus 100.

Thermal interface 111 includes a core layer 112 having surfaces 101 and 102, a coating layer 113 which coats surface 101, and a coating layer 115 which coats surface 102. FIG. 1 shows an example where coating layer 113 coats a portion of surface 101 and coating layer 115 coats a portion of surface 102. In some embodiments, coating layer 113 may coat the entire surface 101 and coating layer 115 may coat the entire surface 102.

Core layer 112 may include a material different from a material coating layers 113 and 115. Coating layers 113 and 115 may include the same material or different materials. In some embodiments, the materials of the core layer 112 and the coating layers 113 and 115 are metallic materials.

Core layer 112 may include pure indium. The material for coating layers 113 and 115 may be selected from gold, tin, a combination of indium and gold, a combination of indium and tin, a combination of indium, tin, and gold, and a combination of indium oxide and tin oxide.

In some embodiments, core layer 112 may include indium and both coating layers 113 and 115 may include the same material. For example, core layer 112 may include indium and both coating layers 113 and 115 may include one of gold, tin, a combination of indium and gold, a combination of indium and tin, a combination of indium, tin, and gold, and a combination of indium oxide and tin oxide. In other embodiments, core layer 112 may include indium and each of the coating layers 113 and 115 may include different materials. For example, core layer 112 may include indium, coating layer 113 may include gold, and coating layer 115 may include a combination of indium and tin. In some embodiments, surface 126 of heat spreader 120 and surface 136 of die 130 may have different materials. Thus, in some embodiments, selecting different materials for coating layers 113 and 115 to match the different materials of heat spreader 120 and die 130 may enhance wetting during the bonding process.

Core layer 112 has a thickness 162. Coating layer 113 has a thickness 163. Coating layer 115 has a thickness 165. In some embodiments, thickness 162 of core layer 112 may be between 6 µm (micrometer) and about 100 µm. In some embodiments, each of the thickness 163 and thickness 165 of coating layers 113 and 115 may be between about 0.1 µm and about 0.5 µm. In other embodiments, each of the thickness 163 and thickness 165 of coating layers 113 and 115 may be between about 3 µm and about 8 µm. Thickness 163 and thickness 165 may be the same or may be different from each other. For example, each of the thickness 163 and thickness 165 may be between about 0.1 µm and about 0.5 µm when both coating layers 113 and 115 are gold; each of the thickness 163 and thickness 165 may be between about 3 µm and about 8 µm when both coating layers 113 and 115 contain a mixture of indium and tin.

Using thermal interface 111 in apparatus 100 may provide the following advantages.

Oxidation of a thermal interface is usually taken into consideration during the bonding process. In FIG. 1, without coating layers 113 and 115, core layer 112 may suffer from oxidization. An oxidized core layer 112 may reduce the bond quality between core layer 112 and heat spreader 120 and die 130. Organic flux is usually used to remove oxidation to improve bonding between components. When flux is used, some amount of organic flux or organic flux residue may remain after the bonding process, thereby affecting the bond quality. In FIG. 1, the inclusion of coating layers 113 and 115 prevents oxidation to core layer 112. Thus, the need to remove the oxidation from the surface core layer 112 during the bonding process is eliminated. Therefore, bonding thermal interface 111 to heat spreader 120 and die 130 may be performed without flux. When no flux is used, the bond quality of thermal interface 111 may be improved because organic flux residue or organic flux is not present after the bonding process.

Thermal resistance in an integrated circuit package plays an important role in determining its performance, reliability, and longevity. In a bonding process with flux, a relatively thicker thermal interface (e.g., thicker than 100 μm) may be necessary to avoid undesirable voids in the thermal interface after the bonding. However, a thicker thermal interface may increase the thermal junction-to-case resistance ($R_{jc}$) of a package such as apparatus 100. The $R_{jc}$ of a package is commonly the measurement of the thermal resistance between a junction within the package (e.g., a top or bottom surface of a die) and a reference point (e.g., a top or bottom of the package). In FIG. 1, the $R_{jc}$ may be the thermal resistance between die 130 and a reference point above it, such as the point above heat spreader 120. Thus, the $R_{jc}$ of apparatus 100 depends on the total thickness of die 130, thermal interface 111, and heat spreader 120. Therefore, $R_{jc}$ depends, in part, on the thickness of thermal interface 111. As described above, when bonding with flux, a thicker thermal interface may be necessary to avoid voids in the thermal interface after the bonding. In FIG. 1, since thermal interface 111 may be bonded to heat spreader 120 and die 130 without flux, a relatively thick thermal interface may not be necessary. Thus, a relatively thinner thermal interface 111 (e.g., less than 100 μm) may be used. A thinner thermal interface, such as thermal interface 111, leads to a lower $R_{jc}$ for apparatus 100. Therefore, dissipating heat from die 130 may be more effective. In some embodiments, the $R_{jc}$ of apparatus 100, when assembled, may be less than 0.1° C./W.

Cost for the material of a thermal interface is a consideration. Some of the materials used for thermal interface 111, for example indium, may be relatively expensive. In FIG. 1, since thermal interface 111 may be a thinner thermal interface, cost may be reduced.

Equipment used to bond a thermal interface, such as thermal interface 111, to a die and a heat spreader may also be a factor. Some conventional techniques perform the bonding process in an environment that involves ovens with some mechanism to remove undesirable elements that are generated in association with the flux used during the bonding process. In FIG. 1, since thermal interface 111 may be bonded to heat spreader 120 and die 130 without flux, simpler equipment or environments may be used. For example, thermal interface 111 may be bonded to die 130 and heat spreader 120 in an environment without a mechanism to remove the undesirable elements associated with flux.

The description herein describes some thickness dimensions for core layer 112 and coating layers 113 and 115, only for examples. Other thickness dimensions may be used. For some embodiments, the thickness dimensions described herein may be more effective than the other thickness dimensions in enhancing wetting during the bonding, in avoiding voids, in reducing junction-to-case resistance $R_{jc}$, or some combination of thereof FIG. 1 shows the components of apparatus 100 before these components are assembled or bonded together. As shown in FIG. 1, core layer 112 of thermal interface 111 is already coated (or pre-coated) with coating layers 113 and 115 before thermal interface 111 is bonded to heat spreader 120 and die 130. Thus, all components of thermal interface 111 of FIG. 1 are already combined (or preformed) before thermal interface 111 is bonded to heat spreader 120 and die 130.

Figure 2:
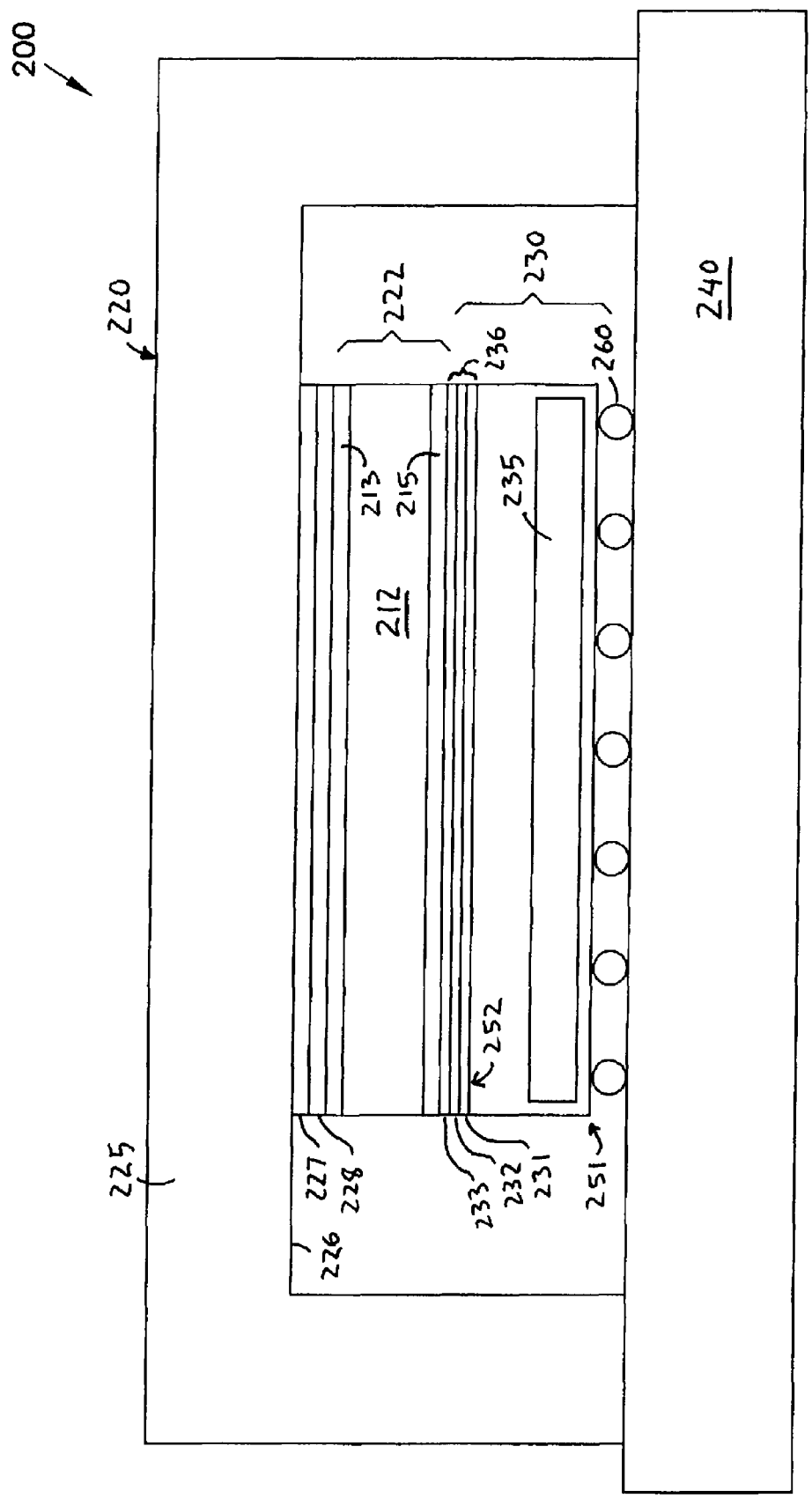
FIG. 2 shows an apparatus according to an embodiment of the invention.

FIG. 2 shows an apparatus 200 according to an embodiment of the invention. In some embodiments, apparatus 200 includes an embodiment of apparatus 100 of FIG. 1 after apparatus 100 is assembled together. In FIG. 2, apparatus 200 includes a package substrate 240, and a thermal interface 222 bonded to a heat spreader 220 and a die 230. In some embodiments, package substrate 240 includes an organic substrate.

Heat spreader 220 includes a layer 225, and layers 227 and 228 covering layer 225. FIG. 2 shows layers 227 and 228 covering only a portion of surface 226 of layer 225. In some embodiments, layer 227, or layer 228, or both may cover the entire surface 226. In some embodiments, layer 225 includes copper, layer 227 includes nickel, and layer 228 includes gold. In some embodiments, layer 227 has a thickness between about 3 μm and 6 μm, and layer 228 has a thickness of about 0.2 μm. Other thickness dimensions may be used.

Die 230 includes surfaces 251 and 252, and an integrated circuit 235 located at an active side of die 230. In FIG. 2, the active side refers to the side with surface 251, which has a number of conductive pads 260 to allow transfer of electrical signals to and from integrated circuit 235. Die 230 also includes a backside which is opposite from the active side. In FIG. 2, the backside refers to the side with surface 252. Integrated circuit 235 is closer to surface 251 (on the active side) than to surface 252 (on the backside). In some embodiments, the location of integrated circuit 235 within die 230 may vary.

Die 230 also includes a metallization structure 236 on surface 252 (on the backside) of die 230. Metallization structure 236 includes a stack of layers 231, 232, and 233. In some embodiments, layer 231 has a thickness of about 0.05 μm; layer 232 has a thickness of about 0.36 μm; and layer 233 has a thickness of about 0.1 μm. Layer 231 may include titanium. Layer 232 may include a combination of nickel and vanadium. Layer 233 may include gold. In some embodiments, metallization structure 236 may include titanium, a combination of nickel and vanadium, and gold arranged in an order different from the order described herein. Metallization structure 236 may include other materials instead of titanium, a combination of nickel and vanadium, and gold.

Thermal interface 222 includes a core layer 212, a coating layer 213, and a coating layer 215. In some embodiments, core layer 212 includes indium and both coating layers 213 and 215 may include the same material, in which the material is one of a combination of indium and gold, a combination of indium and tin, and a combination of indium, tin, and gold. In other embodiments, core layer 212 may include indium and coating layers 213 and 215 may include different materials in which the different materials include two of a combination of indium and gold, a combination of indium and tin, and a combination of indium, tin, and gold.

In some embodiments, thermal interface 222 includes the embodiments of thermal interface 111 of FIG. 1. Thus, before being bonded together, the components of thermal interface 222 of FIG. 2 may include materials and thickness dimensions of thermal interface 111 as described in FIG. 1. In some embodiments, the $R_{jc}$ of apparatus 200 may be less than 0.1° C./W.

In FIG. 2, the components of apparatus 200 are shown in exaggerated dimensions for illustration purposes. In some embodiments, the materials of some of the components of apparatus 200 may combine to form a combination of materials having an intermetallic structure. For example, the materials of the components of thermal interface 222 and the materials of components and at least one of the components of heat spreader 220 and die 230 may combine to form an intermetallic structure of these of materials.

As shown in FIG. 2, thermal interface 222 is bonded to heat spreader 220 and die 230 after a bonding process. In some embodiments, the bonding process may be performed in an oxygen-free environment. In some embodiments, the bonding process may be performed in a nitrogen ($N_2$) environment. In some embodiments, the processing temperature is in a range of about 157° C to about 210° C. In some embodiments, the bonding process may be performed for about two minutes to about one hour. In some embodiments, a device may be used to clip the components of apparatus 200 together with a force (clip force) to improve bonding. In some embodiments, the clip force may be about 10 psi to about 100 psi. In other embodiments, the clip force may be about 30 psi to about 50 psi.

In FIG. 2, thermal interface 222 is bonded to heat spreader 220 and die 230 without using flux (fluxless or in the absence of flux). In the fluxless process, layer 213 directly contacts layer 228 of heat spreader 220, and coating layer 215 directly contacts layer 233 of die 230. Because thermal interface 222 is bonded to heat spreader 220 and die 230 without flux, the interface between heat spreader 220 and die 230, i.e., the interface including thermal interface 222, is substantially free of an organic flux or an organic flux residue. The term "substantially free of" means that, under clean-room conditions that are used during the bonding process, analytical evaluation of apparatus 200 at the level of thermal interface 222 will result in no detectable flux or flux residue, absent a false positive. No detectable flux means that if there were any organic present, it would be below detection, and if not below detection, it would be tracked to a contaminant and not to a residue of a process that was used.

As described above, since the bonding process is performed without flux, the interface between heat spreader 220 and die 230, i.e., the interface including thermal interface 222, may be substantially free of voids. Substantially free of voids means that no voids are present, or if any voids are present, the voids may be less than about 1% by volume. The void fraction can be determined by any known technique. For example, the void fraction can be determined by the Archimedes method, which determines a known density for a given material. For another example, the void fraction can also be determined by using a scanning acoustic microscope (SAM).

Figure 3:
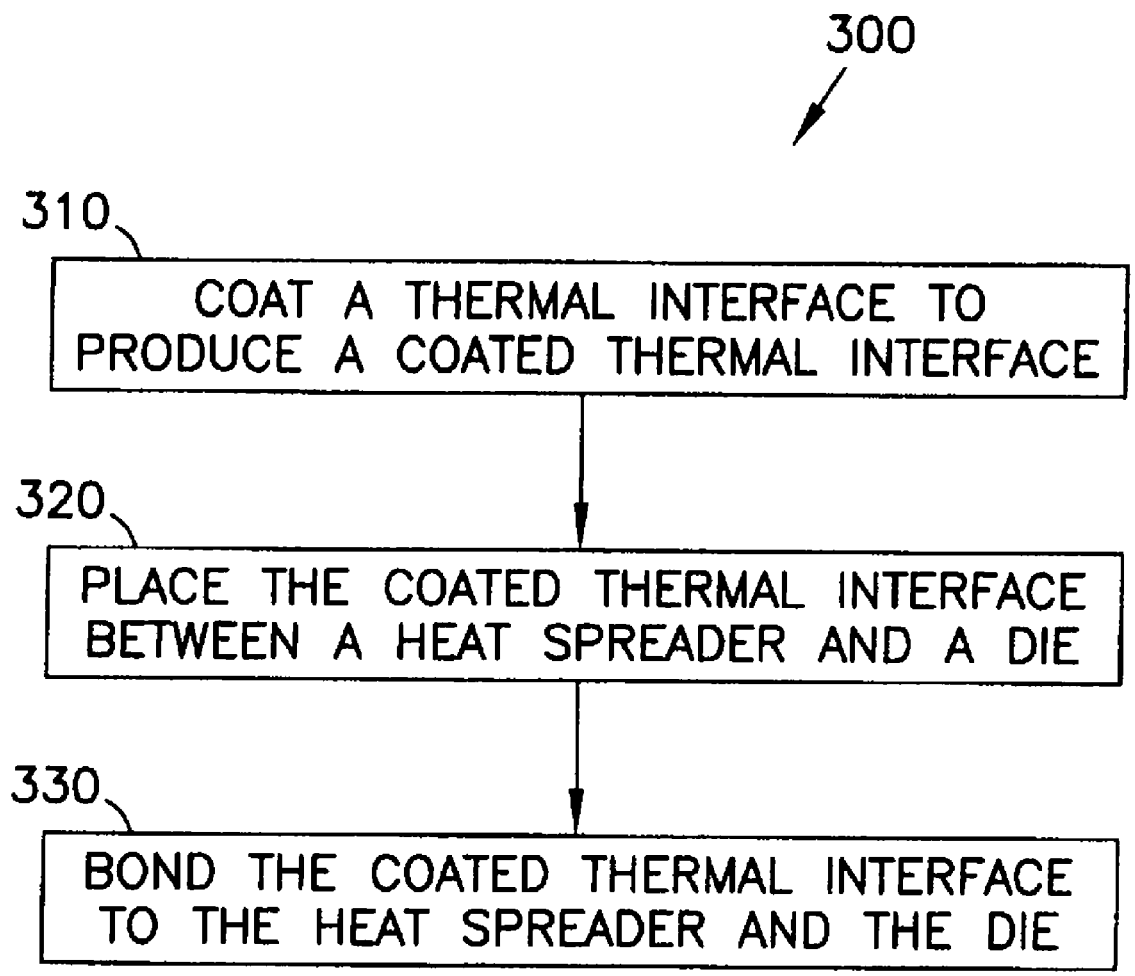
FIG. 3 is a flowchart showing a method according to an embodiment of the invention.

FIG. 3 is a flowchart showing a method according to an embodiment of the invention. Method 300 is shown in schematic form in which some activities may be described but are omitted from FIG. 3 for clarity.

Activity 310 coats a thermal interface to produce a coated thermal interface. Before coating, the thermal interface includes a core layer having a first surface and a second surface opposite from the first surface. Activity 310 coats a first coating layer on at least a portion of the first surface and a second coating layer on at least a portion of the second surface. Activity 310 may coat the coating layers on the surfaces of the core layer by using an atomic spray deposition process, which involves plasma cleaning of the surfaces of the core layer to remove native oxide on the surfaces of the core layer, then a single material or a combination of materials is coated on the surfaces of the core layer. Activity 310 may also coat the coating layers on the core layer by electroplating or by other techniques.

In some embodiments, activity 310 completely coats all surfaces of the core layer such that all multiple surfaces of the core layer are completely coated by the material of the coating layers. For example, the core layer may have six surfaces; the six surfaces may be completely coated such that no uncoated portion remains on core layer. Completely coating all surfaces of core layer may simplify the coating process.

In some embodiments, the core layer may include a material different from a material of the first and second coating layers. The first and second coating layers may include the same material or different materials. In some embodiments, material of the coating layers may react with the material of the core layer such that the coating layer has a mixture or a combination of the material of the core layer material and the material that is used to coat the core layer. In some embodiments the materials of the core layer and the first and second coating layers are metallic materials such that the material of the coating layer and the material of the core layer may form an intermetallic structure coating the core layer.

In some embodiments, the core layer may include indium and the first and second coating layers may include the same material or different materials in which the materials may be selected from gold, tin, a combination of indium and gold, a combination of indium and tin, a combination of indium, tin, and gold, and a combination of indium oxide and tin oxide. As described above, the material of the first and second coating layer and the material of the core layer may form an intermetallic structure coating the core layer. For example, when gold is coated on the core layer of indium, the gold quickly diffuses into the indium core layer and forms an intermetallic compound; thus the core indium layer gets covered with an intermetallic structure of gold and indium.

After the coating, activity 310 creates the coated thermal interface in which all components of the coated thermal interface, i.e. the core layer and the first and second coating layers, are pre-combined or pre-formed.

Activity 320 places the coated thermal interface between a heat spreader and a die in preparation for a bonding process. The heat spreader may include copper or copper covered with a single layer of metal or multiple layers of metals. For example, the heat spreader may include copper with at least a portion of the copper being covered with nickel, gold, or both nickel and gold. The die in activity 320 may include a backside surface covered by a single layer of metal or multiple layers of metals. For example, the die may include a backside surface with at least a portion of the backside surface being covered with nickel or gold, or stack of titanium, a combination of nickel and vanadium, and gold.

Activity 330 bonds the thermal interface to the heat spreader and the die in the bonding process. The bonding process may be performed without flux. In some embodiments, the bonding process may be performed in an oxygen-free environment. In some embodiments, the bonding process may be performed in a nitrogen environment. The bonding process may clip the components together with a force to improve bonding. The process temperature during the bonding process may be about 157° C. to about 210° C.

In a first example, activity 310 of method 300 uses a thermal interface with a combination of indium and tin of about 7 μm thick coated with gold of about 0.05 μm thick. In this first example, activity 320 of method 300 bonds the thermal interface to a heat spreader and a die at a peak temperature of about 175° C. for about 2 minutes. After the bonding in activity 330, the article produced by method 300 is observed to be completely free of voids. Accordingly, the article produced by method 300 is also substantially free of organic flux or an organic flux residue.

In a second example, activity 310 of method 300 uses a thermal interface with a combination of indium and tin of about 6 μm thick. In this second example, activity 320 of method 300 bonds the thermal interface to a heat spreader and a die at a peak temperature of about 210° C. for about 16 minutes. After the bonding in activity 330, the article produced by method 300 is observed to be completely free of voids. Accordingly, the article produced by method 300 is also substantially free of organic flux or an organic flux residue.

Figure 4:
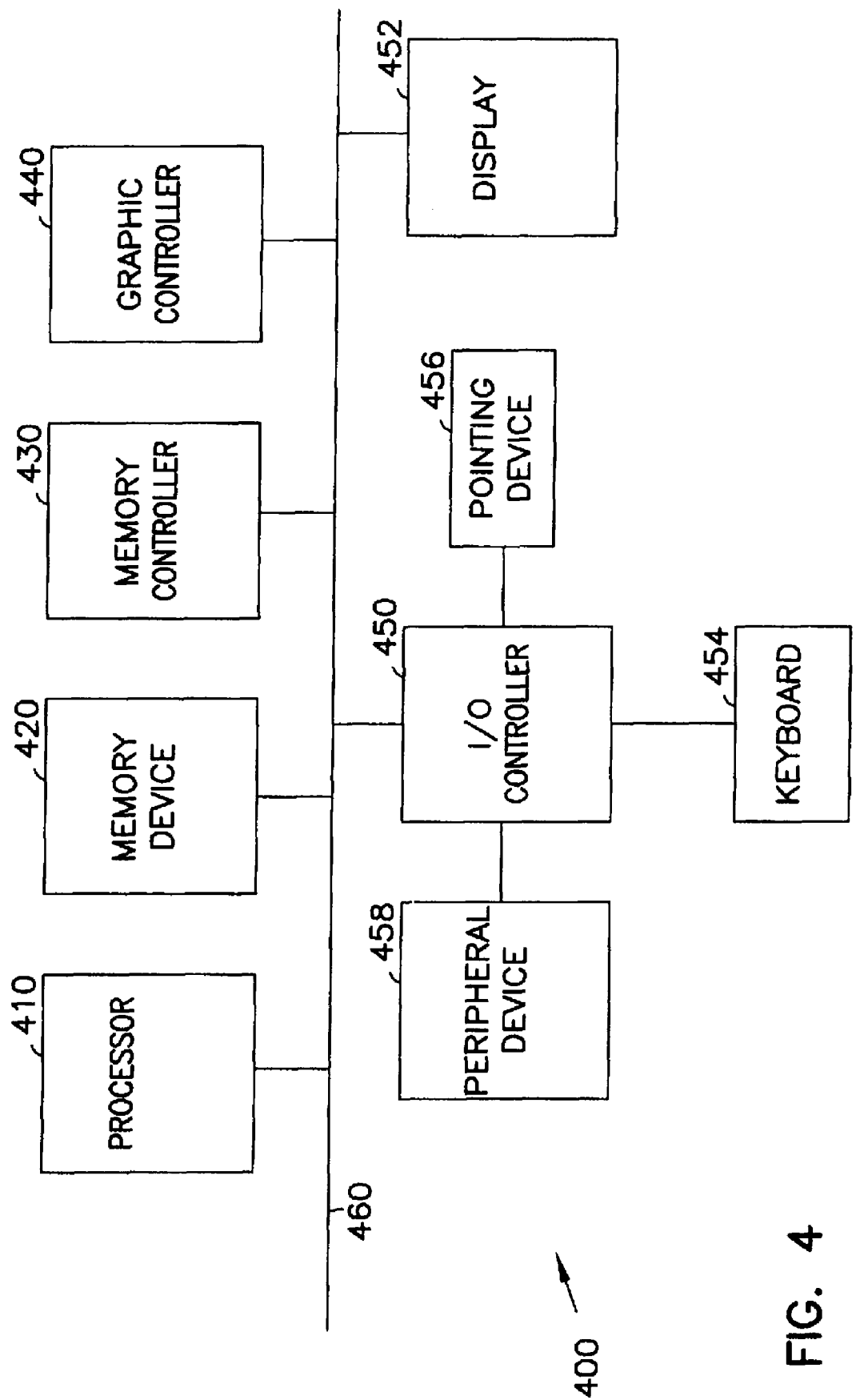
FIG. 4 shows a computer system according to an embodiment of the invention.

FIG. 4 shows a system according to an embodiment of the invention. System 400 includes a processor 410, a memory device 420, a memory controller 430, a graphic controller 440, an input and output (I/O) controller 450, a display 452, a keyboard 454, a pointing device 456, a peripheral device 458, and a bus 460.

Processor 410 may be a general purpose processor or an application specific integrated circuit (ASIC). Memory device 420 may be a dynamic random access memory (DRAM) device, a static random access memory (SRAM) device, a flash memory device, or a combination of these memory devices. I/O controller 450 may include a communication module for wired or wireless communication.

One or more of the components shown in system 400 may be included in one or more integrated circuit packages. For example, processor 410, or memory device 420, or at least a portion of I/O controller 450, or a combination of these components may be included in an integrated circuit package that includes at least one embodiment of an article or apparatus described in FIG. 1 through FIG. 3. Thus, one or more or the components shown in system 400 may include at least one or a combination of a die, a heat spreader, and a thermal interface such as those described in FIG. 1 through FIG. 3.

System 400 may include computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

The above description and the drawings illustrate some specific embodiments of the invention sufficiently to enable those skilled in the art to practice the embodiments of the invention. Other embodiments may incorporate structural, logical, electrical, process, and other changes. In the drawings, like features or like numerals describe substantially similar features throughout the several views. Examples merely typify possible variations. Portions and features of some embodiments may be included in, or substituted for, those of others. Many other embodiments will be apparent to those of skill in the art upon reading and understanding the above description. Therefore, the scope of various embodiments is determined by the appended claims, along with the full range of equivalents to which such claims are entitled.

The Abstract is provided to comply with 37 C.F.R. §1.72(b) requiring an abstract that will allow the reader to quickly ascertain the nature and gist of the technical disclosure. The Abstract is submitted with the understanding that it will not be used to interpret or limit the scope or meaning of the claims.

What is claimed is:

1. A method comprising:
   placing a thermal interface between a die and a heat spreader, wherein the thermal interface includes a core layer, the core layer including a first surface and a second core surface opposite from the first surface, wherein the core layer includes indium, wherein the thermal interface also includes a first coating layer coating at least a portion of the first surface of the core layer, and a second coating layer coating at least a portion of the second surface of the core layer, wherein the core layer includes indium;
   coating the first surface of the core layer with a material to obtain the first coating layer;
   coating the second surface of the core layer with the material to obtain the second coating layer, wherein coating the first and second surfaces of the core layer happens before the thermal interface is placed between the die and the heat spreader; and
   bonding the thermal interface to the die and the heat spreader.

2. A method comprising:
   placing a thermal interface between a die and a heat spreader, wherein the thermal interface includes a core layer, the core layer including a first surface and a second core surface opposite from the first surface, wherein the thermal interface also includes a first coating layer coating at least a portion of the first surface of the core layer, and a second coating layer coating at least a portion of the second surface of the core layer; and
   bonding the thermal interface to the die and the heat spreader The method of claim 1, wherein the core layer includes indium, and wherein both the first and second coating layers include a combination of indium, tin, and gold.

3. A method comprising:
   placing a thermal interface between a die and a heat spreader, wherein the thermal interface includes a core layer, the core layer including a first surface and a second core surface opposite from the first surface, wherein the thermal interface also includes a first coating layer coating at least a portion of the first surface of the core layer, and a second coating layer coating at least a portion of the second surface of the core layer; and
   bonding the thermal interface to the die and the heat spreader, wherein the core layer includes indium, and wherein both the first and second coating layers include a combination of indium oxide and tin oxide.

4. A method comprising:
   placing a thermal interface between a die and a heat spreader, wherein the thermal interface includes a core layer, the core layer including a first surface and a second core surface opposite from the first surface, wherein the thermal interface also includes a first coating layer coating at least a portion of the first surface of the core layer, and a second coating layer coating at least a portion of the second surface of the core layer; and
   bonding the thermal interface to the die and the heat spreader, wherein the core layer includes indium, wherein the first coating layer includes a first material, wherein the second coating layer includes a second material different from the first material, and wherein the first material and the second material include two of a combination of indium and gold, tin, a combination of gold and indium, a combination of indium and tin, a combination of indium, tin, and gold, and a combination of indium oxide and tin oxide.

5. A method comprising:
   placing a thermal interface between a die and a heat spreader, wherein the thermal interface includes a core layer, the core layer including a first surface and a second core surface opposite from the first surface, wherein the thermal interface also includes a first coating layer coating at least a portion of the first surface of the core layer, and a second coating layer coating at least a portion of the second surface of the core layer; and bonding the thermal interface to the die and the heat spreader, wherein bonding is performed in an oxygen-free environment.

6. A method comprising:
placing a thermal interface between a die and a heat spreader, wherein the thermal interface includes a core layer, the core layer including a first surface and a second core surface opposite from the first surface, wherein the thermal interface also includes a first coating layer coating at least a portion of the first surface of the core layer, and a second coating layer coating at least a portion of the second surface of the core layer; and
bonding the thermal interface to the die and the heat spreader, wherein bonding is performed in a nitrogen environment.

7. The method of claim 6, wherein bonding is performed at a temperature between about 157° C. and about 210° C.

8. The method of claim 7, wherein bonding includes clipping the thermal interface, the die, and the heat spreader with a force of about 30 psi to about 50 psi.

9. The method of claim 8, wherein the core layer includes indium of about 6μm to about 100 μm thick.

10. The method of claim 9, wherein each of the first and second coating layers includes gold of about 0.1 μm to about 0.5 μm thick.

11. The method of claim 9, wherein each of the first and second coating layers includes a combination of indium and tin of about 3 μm to about 8 μm thick.

12. A method comprising:
placing a thermal interface between a die and a heat spreader, wherein the thermal interface includes a core layer, the core layer including a first surface and a second core surface opposite from the first surface, wherein the thermal interface also includes a first coating layer coating at least a portion of the first surface of the core layer, and a second coating layer coating at least a portion of the second surface of the core layer; and
bonding the thermal interface to the die and the heat spreader, wherein the heat spreader further includes a layer of nickel covering at least a portion of the copper, wherein the metallization structure further includes a titanium layer, and a combination of nickel and vanadium layer, wherein each of the first and second layers is about 0.1 μm to about 8 μm thick, and wherein bonding is performed in a nitrogen environment with a processing temperature between about 170° C. and about 210° C. for about two minutes to about 16 minutes,
wherein the core layer includes indium, wherein at least one of the first and second coating layers includes one of gold, tin, a combination of indium and gold, a combination of indium and tin, a combination of indium, tin, and gold, and a combination of indium oxide and tin oxide, wherein the heat spreader includes copper coated with gold, and wherein the die includes a metallization structure on a backside of the die, the metallization structure including a gold layer.

13. The method of claim 12, wherein bonding includes clipping the thermal interface, the die, and the heat spreader with a force of about 30 psi to about 50 psi.

14. A method comprising:
placing a thermal interface between a die and a heat spreader, wherein the thermal interface includes
a core layer, the core layer including a first surface and a second core surface opposite from the first surface,
a first coating layer coating at least a portion of the first surface of the core layer; and
a second coating layer coating at least a portion of the second surface of the core layer; the method further including:
clipping the thermal interface, the die, and the heat spreader with a force of about 10 psi to about 100 psi; and
bonding the thermal interface to the die and the heat spreader with a processing temperature between 157° C. to 210° C., and a time for about two minutes to about one hour wherein the core layer (212) includes indium, wherein the first and second coating layers are selected from indium, indium-gold, tin-indium, and tin-indium-gold, wherein the first coating layer (213) is coupled to a gold layer (228) and a nickel layer (227), and wherein the second coating layer (215) is coupled to a gold layer (233), a nickel-vanadium layer (232) and a titanium layer (231) and wherein:
bonding is carried out for about two minutes to about 16 minutes;
clipping the thermal interface, the die, and the heat spreader is carried out with a force of about 30 psi to about 50 psi; and
bonding the thermal interface to the die and the heat spreader is carried out with a processing temperature between 170° C. to 210° C.

15. A method comprising:
placing a thermal interface between a die and a heat spreader, wherein the thermal interface includes
a core layer, the core layer including a first surface and a second core surface opposite from the first surface,
a first coating layer coating at least a portion of the first surface of the core layer; and
a second coating layer coating at least a portion of the second surface of the core layer; the method further including:
clipping the thermal interface, the die, and the heat spreader with a force of about 10 psi to about 100 psi; and
bonding the thermal interface to the die and the heat spreader with a processing temperature between 157° C. to 210° C., and a time for about two minutes to about one hour, wherein the core layer has six surfaces, and the method further including completely coating the core layer such that no uncoated portion remains on the core layer.

16. A method comprising:
placing a thermal interface between a die and a heat spreader, wherein the thermal interface includes
a core layer, the core layer including a first surface and a second core surface opposite from the first surface,
a first coating layer coating at least a portion of the first surface of the core layer; and
a second coating layer coating at least a portion of the second surface of the core layer; the method further including:
clipping the thermal interface, the die, and the heat spreader with a force of about 10 psi to about 100 psi; and
bonding the thermal interface to the die and the heat spreader with a processing temperature between 157° C. to 210° C., and a time for about two minutes to about one hour, wherein bonding is performed in an oxygen-free environment.

17. A method comprising:
placing a thermal interface between a die and a heat spreader, wherein the thermal interface includes
a core layer, the core layer including a first surface and a second core surface opposite from the first surface, a first coating layer coating at least a portion of the first surface of the core layer; and a second coating layer coating at least a portion of the second surface of the core layer; the method further including:

clipping the thermal interface, the die, and the heat spreader with a force of about 10 psi to about 100 psi; and bonding the thermal interface to the die and the heat spreader with a processing temperature between 157° C. to 210° C., and a time for about two minutes to about one hour, wherein bonding is performed in a nitrogen environment.

* * * * *